US012593664B2

(12) United States Patent
Sano et al.

(10) Patent No.: US 12,593,664 B2
(45) Date of Patent: Mar. 31, 2026

(54) METHOD OF MANUFACTURING STRUCTURE AND METHOD OF MANUFACTURING CAPACITOR

(71) Applicant: KABUSHIKI KAISHA TOSHIBA, Tokyo (JP)

(72) Inventors: Mitsuo Sano, Kamakura Kanagawa (JP); Susumu Obata, Yokohama Kanagawa (JP); Kazuhito Higuchi, Yokohama Kanagawa (JP); Takayuki Tajima, Sagamihara Kanagawa (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 238 days.

(21) Appl. No.: 18/183,534

(22) Filed: Mar. 14, 2023

(65) Prior Publication Data

US 2023/0298907 A1 Sep. 21, 2023

(30) Foreign Application Priority Data

Mar. 18, 2022 (JP) ................................. 2022-044281

(51) Int. Cl.
| | |
|---|---|
| *H01L 21/62* | (2006.01) |
| *H01G 4/012* | (2006.01) |
| *H01G 4/33* | (2006.01) |
| *H10D 1/68* | (2025.01) |

(52) U.S. Cl.
CPC ............... *H01L 21/62* (2013.01); *H01G 4/33* (2013.01); *H10D 1/692* (2025.01); *H01G 4/012* (2013.01)

(58) Field of Classification Search
CPC .......... H01L 21/62; H10D 1/692; H01G 4/33; H01G 4/012
See application file for complete search history.

(56) References Cited

U.S. PATENT DOCUMENTS

| | | | | |
|---|---|---|---|---|
| 5,066,609 | A | * | 11/1991 | Yamamoto ............. H10D 1/047 |
| | | | | 438/389 |
| 6,555,430 | B1 | | 4/2003 | Chudzik et al. |
| 10,476,072 | B2 | | 11/2019 | Friend et al. |
| 10,909,158 | B2 | | 2/2021 | Kang et al. |
| 11,508,525 | B2 | | 11/2022 | Higuchi et al. |
| 2001/0051411 | A1 | | 12/2001 | Ito et al. |

(Continued)

FOREIGN PATENT DOCUMENTS

| | | |
|---|---|---|
| CN | 101887845 | 11/2010 |
| JP | S58-087843 | 5/1983 |

(Continued)

OTHER PUBLICATIONS

Office Action issued in France Patent Application No. 2302477 dated Oct. 30, 2024 in 13 pages.

(Continued)

*Primary Examiner* — Richard A Booth
(74) *Attorney, Agent, or Firm* — Knobbe, Martens, Olson & Bear, LLP

(57) ABSTRACT

In general, according to one embodiment, there is provided a method of manufacturing a structure. The method includes forming a recess in a semiconductor substrate; oxidizing at least a bottom inner surface of the recess; and providing at least the bottom inner surface of the recess with a liquid capable of dissolving an oxide of a semiconductor substrate material.

7 Claims, 6 Drawing Sheets

(56)  References Cited

U.S. PATENT DOCUMENTS

| | | |
|---|---|---|
| 2005/0101153 A1 | 5/2005 | Matsumura et al. |
| 2006/0105526 A1 | 5/2006 | Kwon et al. |
| 2010/0029034 A1 | 2/2010 | Nishimoto |
| 2010/0270603 A1* | 10/2010 | Jang .................... H10B 12/485 |
| | | 257/E27.071 |
| 2011/0266521 A1 | 11/2011 | Ferrari et al. |
| 2016/0079078 A1 | 3/2016 | Asano |
| 2019/0252199 A1 | 8/2019 | Matsuo et al. |
| 2020/0219656 A1 | 7/2020 | Higuchi et al. |
| 2021/0090814 A1 | 3/2021 | Sano et al. |

FOREIGN PATENT DOCUMENTS

| | | |
|---|---|---|
| JP | H04-98833 A | 3/1992 |
| JP | H09- 298308 A | 11/1997 |
| JP | H10-335305 A | 12/1998 |
| JP | 2001-351895 A | 12/2001 |
| JP | 4049329 | 2/2008 |
| JP | 4610669 | 1/2011 |
| JP | 2013-527103 | 6/2013 |
| JP | 5724614 | 5/2015 |
| JP | 2017-152710 | 8/2017 |
| JP | 2017-538267 | 12/2017 |
| JP | 2018-018965 | 2/2018 |
| JP | 6834017 | 2/2021 |
| KR | 10-2017-0134292 A | 12/2017 |
| KR | 10-2019-0139974 A | 12/2019 |
| KR | 10-2021-0034493 A | 3/2021 |

OTHER PUBLICATIONS

Office Action issued in Korean Patent Application No. 10-2023-0035133 dated Jan. 13, 2025 in 12 pages.
Office Action issued in Japanese Patent Application No. 2022-044281 dated May 27, 2025 in 8 pages.
Office Action issued in Korean Patent Application No. 10-2023-0035133 dated Jan. 21, 2026, in 8 pages.

* cited by examiner

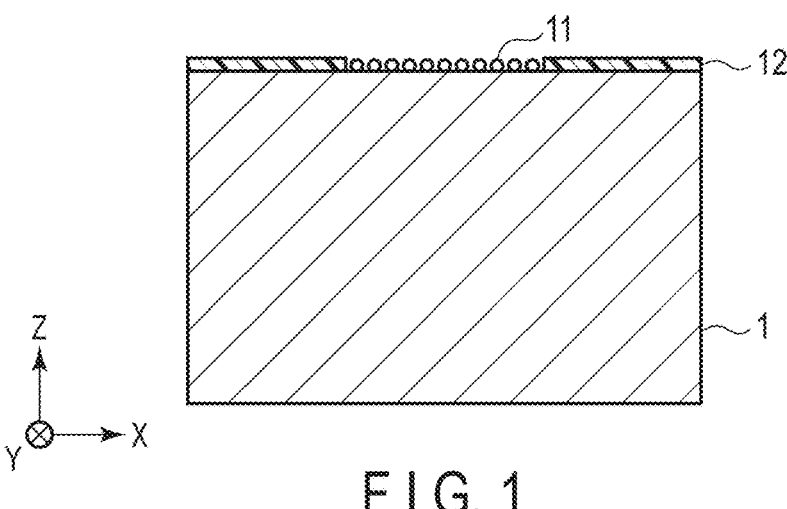
F I G. 1
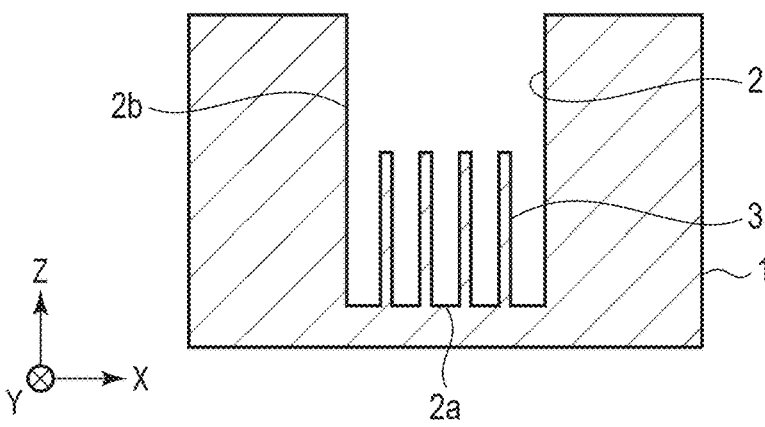
F I G. 2
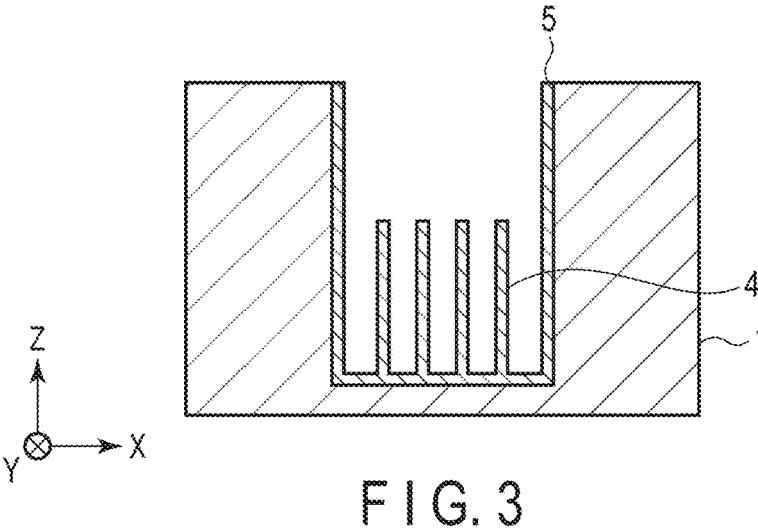
F I G. 3

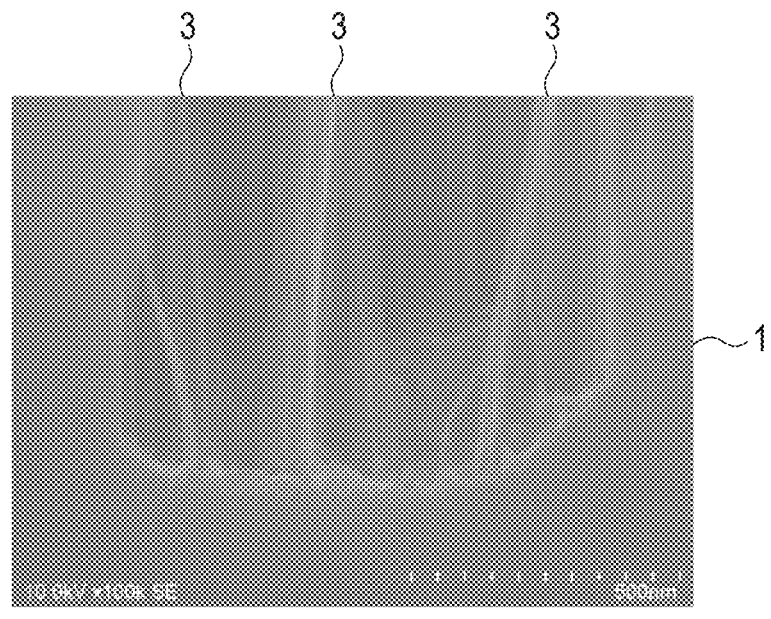
F I G. 10
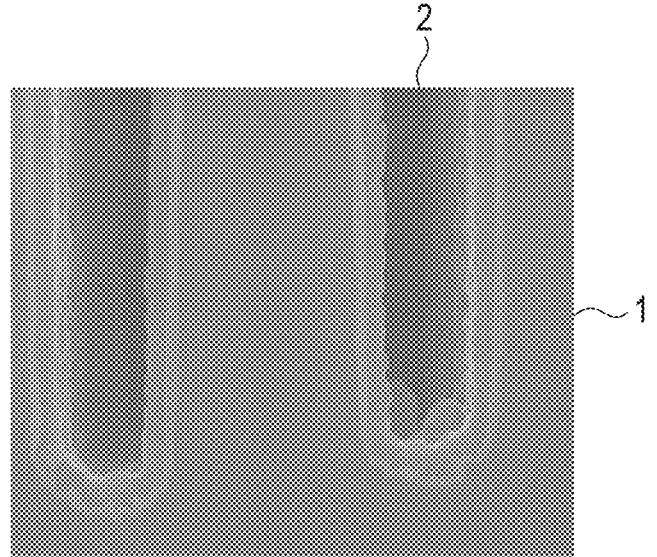
F I G. 11

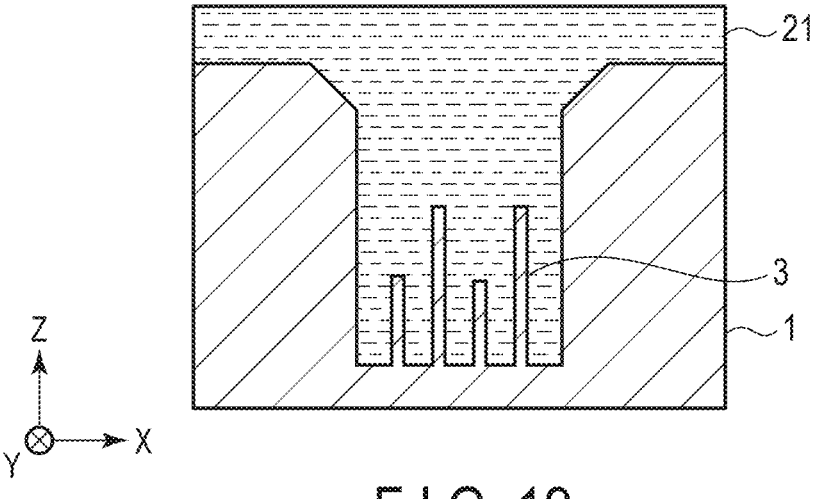
F I G. 12

METHOD OF MANUFACTURING STRUCTURE AND METHOD OF MANUFACTURING CAPACITOR

CROSS-REFERENCE TO RELATED APPLICATIONS

This application is based upon and claims the benefit of priority from Japanese Patent Application No. 2022-044281, filed Mar. 18, 2022, the entire contents of which are incorporated herein by reference.

FIELD

Embodiments of the present invention relate to a method of manufacturing a structure and a method of manufacturing a capacitor.

BACKGROUND

Etching is known as a method of forming a hole or a groove in a semiconductor wafer. As an etching, a MacEtch (Metal-Assisted Chemical Etching) method is known. The MacEtch method is a method of etching a semiconductor substrate with the use of, for example, a noble metal as a catalyst. In a case where a trench having a high aspect ratio is formed in a Si wafer by the MacEtch method, a needle-like elongated shape Si remains on the bottom surface of the trench. This needle-shaped Si may cause cracks at the time of forming a dielectric layer, an insulating layer, an electrode, or the like on the trench in the manufacturing of a capacitor. For example, if a crack occurs in the dielectric layer, leakage failure comes about. In addition, there is a concern that the needle-shaped Si causes a decrease in withstand voltage characteristics due to electric field concentration at a corner portion in the capacitor.

BRIEF DESCRIPTION OF THE DRAWINGS

FIG. 1 is a schematic view illustrating an example of a recess forming process in a method of an embodiment.

FIG. 2 is a schematic view illustrating an example of a state after the recess forming process in the method of the embodiment.

FIG. 3 is a schematic view illustrating an example of an oxidation process in the method of the embodiment.

FIG. 10 is a scanning electron micrograph showing a cross section in the vicinity of the bottom of a trench after the etching process in the method of the embodiment.

FIG. 11 is a scanning electron micrograph showing a cross section in the vicinity of the bottom of a trench in a capacitor that is manufactured by the method of the embodiment.

FIG. 12 is a schematic view illustrating an oxide removing process by the method of Comparative Example.

DETAILED DESCRIPTION

Figure 4:
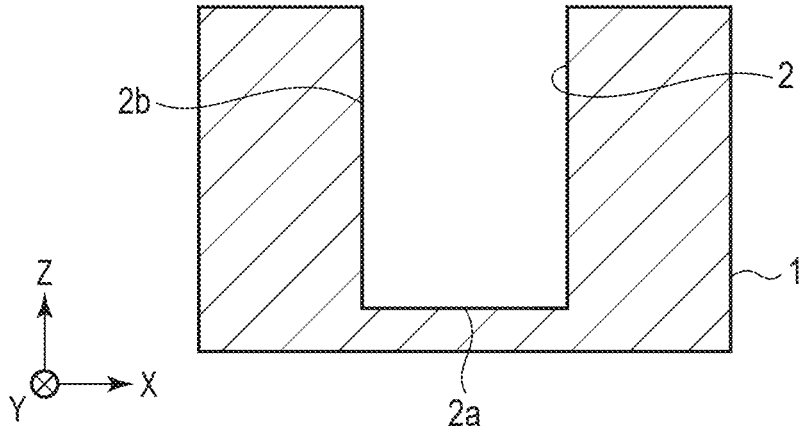
FIG. 4 is a schematic view illustrating an example of an oxide removing process in the method of the embodiment.
Figure 5:
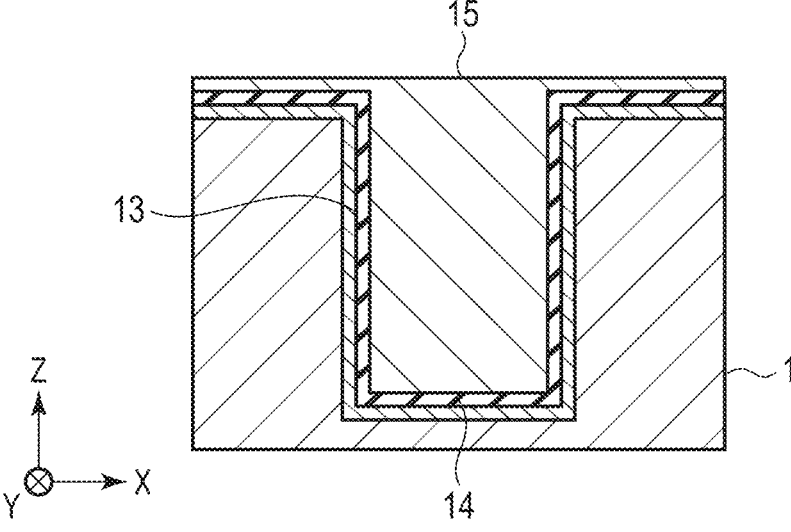
FIG. 5 is a schematic view illustrating a process in the method of manufacturing the capacitor of the embodiment.

In general, according to one embodiment, there is provided a method of manufacturing a structure, the method including:

forming a recess in a semiconductor substrate;

oxidizing at least a bottom inner surface of the recess; and providing at least the bottom inner surface of the recess with a liquid capable of dissolving an oxide of a semiconductor substrate material.

Furthermore, according to an embodiment, there is provided a method of manufacturing a structure, the method including:

forming a recess in a semiconductor substrate;

providing at least a bottom inner surface of the recess with an impurity-containing oxide;

heating the semiconductor substrate in a presence of oxygen gas; and providing at least the bottom inner surface of the recess with a liquid capable of dissolving an oxide of a semiconductor substrate material.

According to another embodiment, there is provided a method of manufacturing a capacitor, the method including: manufacturing a structure including a semiconductor substrate including a recess by the method of any of the embodiments; and forming a conductive layer or a dielectric layer in the recess of the semiconductor substrate.

Hereinafter, embodiments will be described in detail with reference to the drawings. Note that components that exhibit identical or similar functions are denoted by the same reference numerals throughout all the drawings, and redundant description will be omitted.

The semiconductor is selected from, for example, silicon (Si); germanium (Ge); a semiconductor formed of a compound of a Group III element and a Group V element, such as gallium arsenide (GaAs) or gallium nitride (GaN); and silicon carbide (SiC). According to an example, the semiconductor substrate includes silicon. Note that, the term "Group" used herein is a "group" in short form of the periodic table.

The semiconductor substrate is, for example, a semiconductor wafer. The semiconductor wafer may be doped with an impurity, and/or a semiconductor element such as a transistor or a diode may be formed on the semiconductor wafer. Furthermore, the main surface of the semiconductor wafer may be parallel to any crystal plane of the semiconductor. For the semiconductor wafer, for example, there can be used a silicon wafer having a (100) plane as a main surface, or a silicon wafer having a (110) plane as a main surface.

Examples of the semiconductor substrate material include a semiconductor selected from the types thereof described above. The semiconductor substrate material is, for example, Si. Examples of the oxide of the semiconductor substrate material include an oxide of a semiconductor selected from the types thereof described above. This oxide is, for example, Si oxide ($SiO_2$).

First Embodiment

According to a first embodiment, there are provided a method of manufacturing a first structure and a method of manufacturing a first capacitor. These manufacturing methods each includes: forming a recess in a semiconductor substrate; and oxidizing at least the bottom inner surface of the recess to form an oxide of the semiconductor substrate material. These manufacturing methods each further includes providing at least the bottom inner surface of the recess with a liquid that is capable of dissolving an oxide of a semiconductor substrate material by bringing the liquid capable of dissolving the oxide of the semiconductor substrate material into contact with at least the bottom inner surface of the recess, thereby removing the oxide of the semiconductor substrate material.

Hereinafter, each process will be described with reference to FIGS. 1 to 5. In each drawing, a direction parallel to the thickness direction of the semiconductor substrate is defined as a z-axis direction, and a plane parallel to the main surface of the semiconductor substrate is defined as an xy-plane. Note that, there will be described an example in which a trench is formed as a recess.

(Recess Formation)

The formation of a recess (e.g., a trench) in the semiconductor substrate is conducted by etching, for example. As an example of the etching, there can be exemplified an etching process with the use of a catalyst containing a noble metal, as it is called MacEtch (Metal-Assisted Chemical Etching) method. The formation of a recess (e.g., a trench) by the MacEtch method will be described with reference to FIG. 1. The semiconductor substrate 1 can be, for example, a Si substrate (silicon wafer). On one main surface of the semiconductor substrate 1 along the xy-plane, a catalyst layer 11 including a noble metal is formed at a portion where a recess is to be formed, and a mask layer 12 is formed at a portion where no recess is to be formed. The main surface where the catalyst layer 11 and the mask layer 12 are formed is brought into contact with an etching agent (not illustrated) in which an oxidizing agent and a corrosive agent are contained. As a result of this, the oxidizing agent oxidizes a portion of the surface adjacent to the noble metal, and the corrosive agent dissolves and removes the oxide. Therefore, the etching agent can etch the surface of the semiconductor substrate in a direction perpendicular to the surface (e.g., the z-axis direction) under the action of the catalyst layer. As a result of this, for example, as illustrated in FIG. 2, a recess 2 (e.g., a trench) having a depth in the z-axis direction can be formed in the semiconductor substrate 1. Note that the recess (trench) 2 extends along a y-axis direction. Furthermore, a plurality of recesses (trenches) 2 may be provided while being spaced apart from each other along an x-axis direction.

Here, examples of the catalyst layer, the mask layer, and the etching agent are as follows.

Examples of the materials of the mask layer include: organic materials such as polyimide, fluororesin, phenol resin, acrylic resin, and novolak resin; and inorganic materials such as silicon oxide and silicon nitride.

In the catalyst layer, the noble metal can be present, for example, as noble metal particles. The noble metal is, for example, one or more metals selected from the group consisting of Au, Ag, Pt, Pd, Ru, and Rh.

The thickness of the catalyst layer is preferably in a range of from 0.01 μm to 0.3 μm, and more preferably in a range of from 0.05 μm to 0.2 μm. If the catalyst layer is too thick, the etching agent is difficult to reach the semiconductor, and hence etching is difficult to proceed. If the catalyst layer is too thin, the ratio of the total surface area of the noble metal particles to the area to be etched is too small, and hence etching is difficult to proceed.

Note that the thickness of the catalyst layer is a distance from one main surface to the opposite main surface of the catalyst layer in an image obtained by observing a cross section parallel to the thickness direction thereof with a scanning electron microscope (SEM).

The catalyst layer may include a discontinuous portion.

The shape of the noble metal particle is preferably spherical. The shape of the noble metal particle may be, for example, in other shapes such as a rod shape or a plate shape. The noble metal particle serves as a catalyst for the oxidation reaction of the semiconductor surface that is in contact with the noble metal particle.

The particle size of the noble metal particles is preferably in the range of from 0.001 μm to 1 μm, and more preferably in the range of from 0.01 μm to 0.5 μm.

Note that, the "particle size" as used herein is a value obtained by the following method. First, the main surface of the catalyst layer is photographed with a scanning electron microscope. The magnification is within a range of from 10,000× to 100,000×. Next, the area of each of the noble metal particles is determined in the image. Assuming that each noble metal particle is spherical, the diameter of the noble metal particle is then obtained from the area as determined above. This diameter is defined as the "particle size" of the noble metal particle.

The catalyst layer can be a porous catalyst layer.

The catalyst layer can be formed by, for example, electrolytic plating, reduction plating, or displacement plating. The application of a dispersion liquid including noble metal particles, or a vapor-phase deposition method such as vapor deposition and sputter deposition can be used to form the catalyst layer. Among these methods, displacement plating can directly and uniformly deposit a noble metal on a surface formed of a semiconductor. Hereinafter, formation of the porous catalyst layer by displacement plating will be described as an example.

For deposition of a noble metal by displacement plating, for example, an aqueous solution containing a salt of tetrachloroauric(III) acid or a solution containing silver nitrate can be used. An example of this process will be described below.

The displacement plating solution is, for example, a mixed solution of an aqueous solution of hydrogen tetrachloroaurate(III) tetrahydrate and hydrofluoric acid. Hydrofluoric acid has an action of removing a native oxide film on a surface formed of a semiconductor.

In a case where the semiconductor substrate is immersed in the displacement plating solution, the native oxide film on the surface of the semiconductor substrate is removed, and a noble metal, gold in this case, is deposited on the surface of the semiconductor substrate. As a result of this, a porous catalyst layer is obtained.

The concentration of hydrogen tetrachloroaurate(III) tetrahydrate in the displacement plating solution is preferably in the range of from 0.0001 mol/L to 0.01 mol/L. The concentration of hydrogen fluoride in the displacement plating solution is preferably in the range of from 0.1 mol/L to 6.5 mol/L.

Note that the displacement plating solution may further contain a sulfur-based complexing agent. Alternatively, the displacement plating solution may further contain glycine and citric acid.

The etching agent includes a corrosive agent and an oxidizing agent. The etching agent may include water as a solvent. The etching agent can be an aqueous solution.

The corrosive agent can dissolve an oxide of the semiconductor substrate material. This oxide is, for example, $SiO_2$. The corrosive agent is, for example, hydrofluoric acid or ammonium fluoride. One type or two or more types of the corrosive agent can be used. Taking the etching rate into consideration, a corrosive agent containing hydrofluoric acid is preferable.

The hydrogen fluoride concentration in the etching agent is preferably in the range of from 0.4 mol/L to 20 mol/L, more preferably in the range of from 0.8 mol/L to 16 mol/L, and still more preferably in the range of from 2 mol/L to 10 mol/L. If the hydrogen fluoride concentration is too low, it is difficult to achieve a high etching rate. If the hydrogen fluoride concentration is too high, there is a possibility that controllability of etching in a processing direction (e.g., in the thickness direction of the semiconductor substrate) is deteriorated.

The oxidizing agent in the etching agent can be, for example, at least one oxidizing agent selected from hydrogen peroxide, nitric acid, $AgNO_3$, $KAuCl_4$, $HAuCl_4$, $K_2PtCl_6$, $H_2PtCl_6$, $Fe(NO_3)_3$, $Ni(NO_3)_2$, $Mg(NO_3)_2$, $Na_2S_2O_8$, $K_2S_2O_8$, $KMnO_4$, and $K_2Cr_2O_7$. Hydrogen peroxide is preferable as the oxidizing agent since no harmful by-product is generated and no contamination of the semiconductor element occurs.

The concentration of the oxidizing agent such as hydrogen peroxide in the etching agent is preferably in a range of from 0.2 mol/L to 8 mol/L, more preferably in a range of from 0.5 mol/L to 5 mol/L, and still more preferably in a range of from 0.5 mol/L to 4 mol/L. If the concentration of the oxidizing agent is too low, it is difficult to achieve a high etching rate. If the concentration of the oxidizing agent is too high, there is a possibility that an excessive side etching may occur.

In a case where the recess is processed by the MacEtch method, etching proceeds along the catalyst. On the other hand, due to porosity, unevenness at the time of formation or the like, the catalyst layer does not completely cover the portion of the semiconductor substrate where the recess is to be formed, and there may be a partially uncovered portion. In the partially uncovered portion, processing does not proceed, and as illustrated in FIG. 2, a needle-like elongated semiconductor substrate material 3 (e.g., needle-shaped Si) remains on the bottom inner surface 2a of the formed recess 2. Note that, in FIG. 2, the catalyst layer and the mask layer are omitted for convenience of description. For example, in a case where a dielectric layer or the like is formed on the recess 2 in order to manufacture a capacitor, there is a risk that a crack occurs in the dielectric layer due to breakage of the needle-shaped semiconductor substrate material 3 or the like, resulting in leakage failure. In addition, since a portion where the needle-shaped semiconductor substrate material 3 presents can be a corner portion, there is a concern that this may cause a decrease in withstand voltage characteristics due to electric field concentration at the corner portion. In order to remove the needle-shaped semiconductor substrate material 3, an oxidation process and an oxide removal process described below are performed.

(Removal of Catalyst Layer and Mask Layer)

Prior to perform the oxidation process, a process of removing the catalyst layer and the mask layer may be performed.

The removal of the catalyst layer can be performed, for example, by washing with aqua regia. The mask layer can be removed by, for example, washing with hot phosphoric acid.

Note that in a case where there is no residue of the mask layer, the removal of the mask layer can be omitted.

(Oxidation)

At least the bottom inner surface 2a of the inner surface of the recess 2 is oxidized to form an oxide of the semiconductor substrate material. An example of the oxidation process is illustrated in FIG. 3. In FIG. 3, in addition to the bottom inner surface 2a of the recess 2, the side wall 2b is also oxidized. As a result, the surface layer portion 5 of the entire inner surface of the recess 2 is oxidized to form an oxide of the semiconductor substrate material. In addition, since the needle-shaped semiconductor substrate material 3 is as thin as, for example, several tens of nanometers, the entire needle-shaped semiconductor substrate material 3 is oxidized to become the oxide 4 of the needle-shaped semiconductor substrate material as the oxidation of the surface layer portion 5 on the inner surface of the recess 2 progresses.

The oxidation method is not particularly limited, and examples thereof include thermal oxidation, anodic oxidation, and photo-oxidation. The thermal oxidation is an oxidation carried out at a high temperature, and the temperature is desirably equal to or lower than the melting point of the semiconductor substrate material. Silicon (Si), as an example of a semiconductor substrate material, has a melting point of about 1400° C. Therefore, in a case where a Si substrate (Si wafer) is used as the semiconductor substrate, the thermal oxidation temperature is desirably 800° C. or higher and 1100° C. or lower. This enables to stably perform the oxidation and to increase the film formation rate of the Si oxide film.

The feed rate of oxygen gas at the time of performing the thermal oxidation is desirably 0.5 L/min or more and 10 L/min or less. The oxidation rate of the semiconductor substrate material (e.g., Si) varies with the partial pressure of the oxygen gas in an oxygen gas-containing atmosphere, and the oxide formation rate tends to be higher according to increased oxygen partial pressure, so that oxidation can be stably performed. A trace amount of $Cl_2$ and/or HCl gas can be added to the oxygen gas-containing atmosphere, thereby promoting the oxidation. The oxygen gas-containing atmosphere may contain HCl gas in an amount of about 1 to 10%.

The anodic oxidation is a method of forming an oxide film on the surface layer of a semiconductor substrate by applying a potential with use of the semiconductor substrate as an anode in an electrolytic solution. Photo-oxidation is a method of local oxidation by laser. On the other hand, by chemical vapor deposition (CVD) method, an oxide film (e.g., a Si oxide film) can be formed on a semiconductor substrate, but CVD method does not oxidize the semiconductor substrate itself. Therefore, by the CVD method, only the oxide film is formed on the needle-shaped semiconductor substrate material, and the needle-shaped semiconductor substrate material itself remains unoxidized. Therefore, what is removed in the subsequent process is only the oxide film on the needle-shaped semiconductor substrate material.

(Removal of Oxide)

The oxide of the semiconductor substrate material formed by the oxidation described above can be removed by a liquid (processing liquid) capable of dissolving the oxide of the semiconductor substrate material. As a result of this, as illustrated in FIG. 4, the needle-shaped portion on the bottom inner surface 2a of the recess 2 and other minute roughness can be removed. The processing liquid needs to be in contact with a portion of the semiconductor substrate to be processed, and examples of the method therefor include the immersion of the semiconductor substrate in the processing liquid.

Examples of the liquid capable of dissolving the oxide of the semiconductor substrate material include hydrofluoric acid (aqueous solution of hydrogen fluoride). The concentration of hydrofluoric acid can be 0.1 mol/L or more and 5 mol/L or less. The concentration of hydrofluoric acid is adjusted so as to be within the range mentioned above, thereby enabling to reduce damages at the occasion where the upper end of the recess or the like is contact with the liquid while promoting the dissolution of the oxide of the semiconductor substrate material.

By the method described above, there can be manufactured a structure that includes a semiconductor substrate provided with one or more recesses. An electrode is formed on the semiconductor substrate of the obtained structure and, if necessary, an insulating layer, a dielectric layer, or the like is provided, whereby a capacitor can be manufactured. An example of the method of manufacturing a capacitor will be described with reference to FIG. 5. First, a P-type or N-type impurity is doped into a surface region (including the inner surface of the recess) of the semiconductor substrate 1 to form a first conductive layer 13 as a lower electrode. Next, a dielectric layer 14 is formed on the first conductive layer 13. The dielectric layer 14 is formed of, for example, an organic dielectric material or an inorganic dielectric material. The dielectric layer 14 can be formed by, for example, chemical vapor deposition (CVD). Alternatively, the dielectric layer can be formed by oxidizing, nitriding, or oxynitriding the surface of the first conductive layer.

Next, a second conductive layer 15 as an upper electrode is formed on the dielectric layer 14. The second conductive layer 15 is formed from, for example, a conductive layer formed of polysilicon or a metal.

Thereafter, the dielectric layer 14 is patterned. Next, a metal layer is deposited by sputter deposition or plating, and this layer is patterned to obtain an internal electrode (e.g., an aluminum electrode). Thereafter, an insulating layer is formed. The insulating layer can be formed by, for example, a combination of deposition by CVD and photolithography. Next, an external electrode is formed on the insulating layer. The external electrode can be formed by, for example, a combination of deposition by sputter deposition or plating and photolithography. Thereafter, the structure thus obtained is diced to obtain a capacitor.

According to the first embodiment described above, there can be provide a method of manufacturing a structure and a method of manufacturing a capacitor, each of which is capable of eliminating defects that may occur at the time of processing a recess in a semiconductor substrate.

Second Embodiment

According to a second embodiment, there are provided a method of manufacturing a second structure and a method of manufacturing a second capacitor. These manufacturing methods each includes: forming a recess in a semiconductor substrate; providing at least a bottom inner surface of the recess with an impurity-containing oxide; and heating the semiconductor substrate in the presence of oxygen gas to dope the impurity into the semiconductor substrate and forming an oxide of the semiconductor substrate material at at least the bottom inner surface of the recess. These manufacturing methods each includes providing at least the bottom inner surface of the recess with a liquid that is capable of dissolving an oxide of a semiconductor substrate material by bringing the liquid capable of dissolving the oxide of the semiconductor substrate material into contact with at least the bottom inner surface of the recess, thereby removing the oxide of the semiconductor substrate material.

Hereinafter, each process will be described with reference to FIGS. 6 to 9. In each drawing, a direction parallel to the thickness direction of the semiconductor substrate is defined as a z-axis direction, and a plane parallel to the main surface of the semiconductor substrate is defined as an xy-plane. Note that, there will be described an example in which a trench is formed as a recess.

(Recess Formation)

The process of forming the recess in the semiconductor substrate can be performed in the same manner as described in the first embodiment.

(Removal of Catalyst Layer and Mask Layer)

A process of removing the catalyst layer and the mask layer may be performed prior to forming the impurity-containing oxide. The removing process can be performed in the same manner as described in the first embodiment.

(Formation of Impurity-Containing Oxide)

Figure 6:
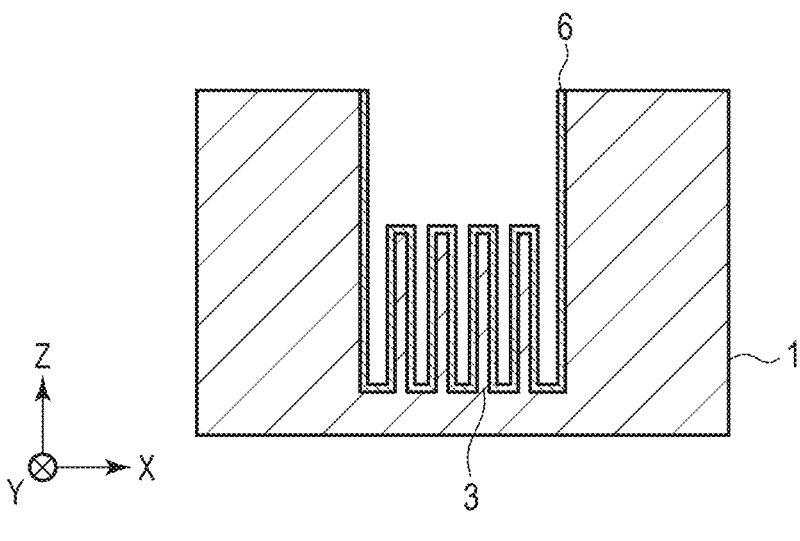
FIG. 6 is a schematic view illustrating an example of a process of forming an impurity-containing oxide in the method of the embodiment.

An impurity-containing oxide is formed at at least the bottom inner surface of the recess. An example of this process is illustrated in FIG. 6. An impurity-containing oxide layer 6 is formed at the entire inner surface of the recess 2. As a result of this, the impurity-containing oxide layer 6 is also formed at the needle-shaped semiconductor substrate material 3. The impurity-containing oxide layer 6 may be formed only at the bottom inner surface where the needle-shaped semiconductor substrate material 3 can present, but may be formed at the entire inner surface of the recess 2, or may be formed at the main surface of the semiconductor substrate 1 in addition to the entire inner surface. In a case where the impurity-containing oxide layer 6 is formed at the entire inner surface of the recess 2 and the main surface of the semiconductor substrate 1, portions other than a target portion may be covered with a mask layer in order not to oxidize the portions other than the target portion in a subsequent process, and then heated in the presence of oxygen gas.

The method of forming the impurity-containing oxide is not particularly limited, and examples thereof include chemical vapor deposition (CVD), low pressure chemical vapor deposition (LPCVD), and ion implantation.

The impurity is not particularly limited as long as it can reduce the resistance of the substrate, and examples thereof include a P-type impurity (e.g., B (boron)) and an N-type impurity (e.g., P (phosphorus) or As (arsenic)). One or more kind of the impurity can be used.

In a case where P (phosphorus) is used as an impurity and the formation of the P-containing oxide is conducted by the CVD method, the formation can be performed under the following conditions. The source gas contains a P-compound gas, and may optionally contain at least one of $N_2$ gas as a dilution gas or $O_2$ gas as an oxidation gas. Examples of the P-compound gas include $POCl_3$ gas, $PH_3$ gas, and $PF_5$ gas.

The flow rate of the source gas can be, for example, in the following range. The flow rate of the P-compound gas such as $POCl_3$ gas can be 0.5 L/min or more and 1 L/min or less. The flow rate of $N_2$ gas can be chosen to be 5 L/min or more and 30 L/min or less. The flow rate of $O_2$ gas can be 0.5 L/min or more and 5 L/min or less.

The processing temperature can be in the range of 900° C. or more and 1200° C. or less. The processing time can be in the range of 20 minutes or more and 60 minutes or less.

(Impurity Doping and Oxidation)

Figure 7:
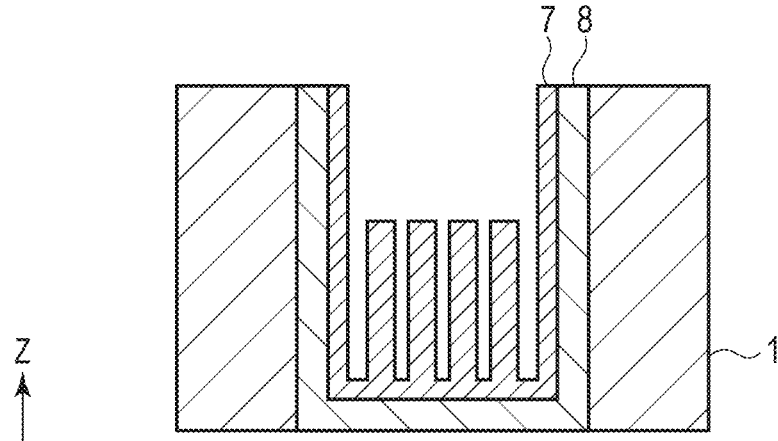
FIG. 7 is a schematic view illustrating an example of an oxidation process in the method of the embodiment.

By heating the semiconductor substrate in the presence of oxygen gas, the impurity is doped into the semiconductor substrate, and an oxide of the semiconductor substrate material is formed at at least the bottom inner surface of the recess. An example of this process is illustrated in FIG. 7. The semiconductor substrate 1 having the impurity-containing oxide layer 6 formed is heated in the presence of oxygen gas, thereby oxidizing the semiconductor substrate material (e.g., Si) in the surface layer portion 7 including the inner surface of the recess 2 of the semiconductor substrate 1. Since the needle-shaped semiconductor substrate material 3 is as thin as, for example, several tens of nanometers, the entire needle-shaped semiconductor substrate material 3 is oxidized to become an oxide of the needle-shaped semiconductor substrate material as the oxidation of the surface layer portion 7 of the semiconductor substrate 1 progresses. During this oxidation, thermal diffusion of the impurity takes place, and the impurity is doped from the surface layer portion 7 including the inner surface of the recess 2 to an internal region 8 in the semiconductor substrate 1. The impurity-doped surface layer portion 7 and internal region 8 became to have low resistance.

The heating temperature is desirably equal to or lower than the melting point of the semiconductor substrate material. Silicon (Si), as an example of a semiconductor substrate material, has a melting point of about 1400° C. Therefore, in a case where a Si substrate or Si wafer is used as the semiconductor substrate, the heating temperature is desirably 900° C. or higher and 1350° C. or lower. As a result of this, oxidation can be stably performed, and diffusion of the impurity can be promoted.

The heating can be performed under an atmosphere containing $N_2$ gas and $O_2$ gas. The feed rate of the oxygen gas is desirably 0.5 L/min or more and 5 L/min or less. The oxidation rate of the semiconductor substrate material (e.g., Si) varies with the partial pressure of the oxygen gas in the atmosphere, and the oxide formation rate tends to be higher according to increased oxygen partial pressure, so that oxidation can be stably performed. The feed rate of the nitrogen gas is preferably 5 L/min or more and 30 L/min or less.

(Removal of Oxide)

Figure 8:
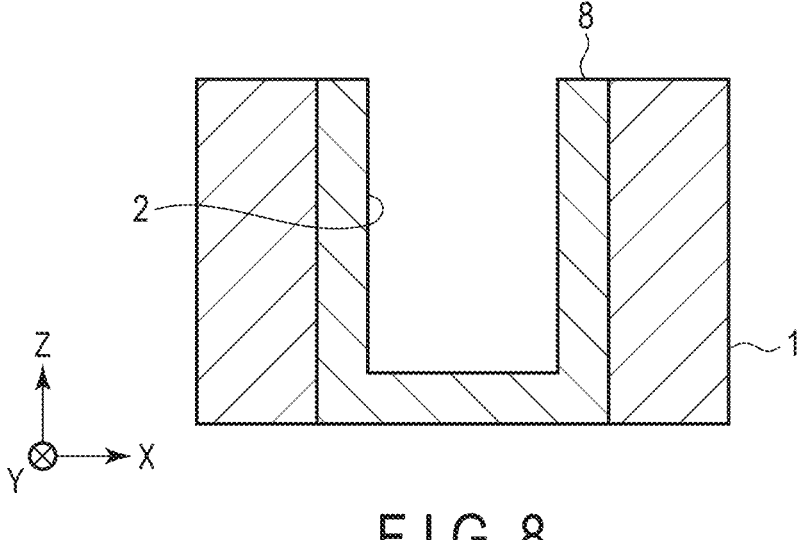
FIG. 8 is a schematic view illustrating an example of an oxide removing process in the method of the embodiment.
Figure 9:
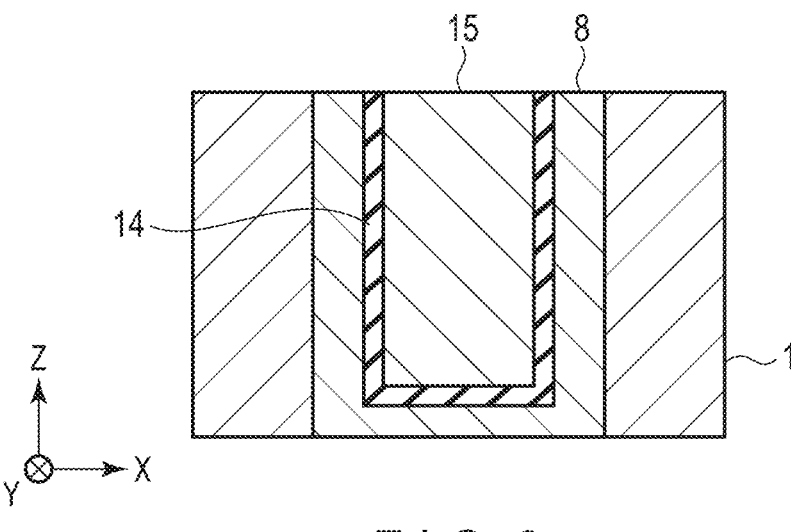
FIG. 9 is a schematic view illustrating a process in the method of manufacturing a capacitor according to the embodiment.

A liquid (processing liquid) capable of dissolving an oxide of the semiconductor substrate material is brought into contact with the surface layer portion 7 (including the needle-shaped portion) of the semiconductor substrate 1, thereby removing the oxide of the semiconductor substrate material present in the surface layer portion 7. The processing liquid needs to be in contact with a portion of the semiconductor substrate to be processed, and examples of the method therefor include the immersion of the semiconductor substrate in the processing liquid. As a result of this, as illustrated in FIG. 8, in addition to the needle-shaped portion on the bottom inner surface of the recess 2 and other minute roughness, a residual impurity-containing oxide in the semiconductor substrate 1 can be removed. Note that, in the region where the impurity is doped, the region 8 where the semiconductor substrate remains unoxidized is not dissolved in the processing liquid, and thus remains in the semiconductor substrate 1.

As the liquid capable of dissolving the oxide of the semiconductor substrate material, there can be mentioned the same liquid as described in the first embodiment.

By the method described above, there can be manufactured a structure that includes a semiconductor substrate provided with one or more recesses. A method of manufacturing a capacitor using this structure will be described with reference to FIG. 9. The impurity-doped region 8 formed by the method described above becomes a first conductive layer. A dielectric layer 14 is formed on the first conductive layer 8. The dielectric layer 14 can be formed in the same manner as described in the first embodiment. Next, a second conductive layer 15 as an upper electrode of the capacitor is formed on the dielectric layer 14. The second conductive layer 15 can be formed in the same manner as described in the first embodiment.

Subsequent processes can be conducted in the same manner as described in the first embodiment, and a capacitor is obtained.

According to the method of manufacturing a structure and the method of manufacturing a capacitor of the second embodiment described above, the needle-shaped portion can be removed in the process of doping an impurity into the semiconductor substrate, and thus defects that can occur at the time of recess processing can be eliminated in an efficient way.

FIG. 10 shows scanning electron micrograph showing the state of the bottom of the recess (trench in this case) after the recess forming process in the methods of the first embodiment and the second embodiment. FIG. 10 is an enlarged scanning electron micrograph of a trench bottom in a cross section of the semiconductor substrate (e.g., Si wafer) 1 cut along the z-axis direction (thickness direction). As shown in FIG. 10, it can be seen that a plurality of needle-shaped Si 3 protrudes upward from the bottom surface of the trench 2.

The removal of the needle-shaped Si and the formation of the dielectric layer and the second conductive layer were conducted according to the method of the second embodiment, and then scanning electron microscope observation was performed. Note that P was used as an impurity, and the oxide layer containing P was formed by CVD method. An example of the observation result is shown in FIG. 11. FIG. 11 is an enlarged scanning electron micrograph of the trench bottom in the cross section of the Si wafer (semiconductor substrate 1) cut along the z-axis direction (thickness direction). As shown in FIG. 11, no needle-shaped Si was observed on the bottom surface of the trench 2, and it was able to be confirmed that there were no defects such as corner portions in the dielectric layer and the second conductive layer.

In addition, the needle-shaped Si was removed and the first conductive layer, the dielectric layer, and the second conductive layer were formed according to the method of the first embodiment, followed by scanning electron microscope observation, in which it was able to be confirmed that no needle-shaped Si was observed on the bottom surface of the trench, and no defects such as corner portions were confirmed in the dielectric layer and the second conductive layer. Note that oxidation in the removal of needle-shaped Si was carried out by thermal oxidation.

On the other hand, the needle-shaped Si was removed by neither the method according to the first embodiment nor the method according to the second embodiment but by immersion in the processing liquid 21 including fluoronitric acid or an aqueous alkali solution as shown in FIG. 12, this has resulted in that a part of the needle-shaped Si 3 remained. In addition, the substrate was immersed in the processing liquid 21 for a long time in order to completely remove the needle-shaped Si 3, this has resulted in the occurrence of damages such as generation of pores at the upper end of the trench.

According to the method of at least one embodiment described above, since the method includes providing at least the bottom inner surface of the recess with an oxide of the semiconductor substrate material and providing at least the bottom inner surface of the recess with a liquid that is capable of dissolving an oxide of a semiconductor substrate material, it is possible to eliminate defects that may occur at the time of processing the recess.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a structure, comprising:

forming a recess in a Si substrate as a semiconductor substrate;

oxidizing at least a needle-shaped semiconductor substrate material on a bottom inner surface of the recess to form a needle-shaped Si oxide on the bottom inner surface of the recess; and providing at least the needle-shaped Si oxide on the bottom inner surface of the recess with a liquid that is capable of dissolving a Si oxide, thereby dissolving the needle-shaped Si oxide.

2. The method of manufacturing a structure according to claim 1, wherein the formation of the recess in the semiconductor substrate is performed by etching with use of a catalyst that comprises a noble metal.

3. The method of manufacturing a structure according to claim 2, wherein the etching with use of the catalyst that comprises the noble metal is metal-assisted chemical etching.

4. The method of manufacturing a structure according to claim 1, wherein the oxidation is thermal oxidation, anodic oxidation, or photo-oxidation.

5. The method of manufacturing a structure according to claim 1, wherein the liquid that is capable of dissolving the Si oxide comprises hydrogen fluoride.

6. The method of manufacturing a structure according to claim 1, wherein the needle-shaped semiconductor substrate material remains on the bottom inner surface of the recess after the formation of the recess.

7. The method of manufacturing a structure according to claim 6, wherein the formation of the recess in the semiconductor substrate is performed by etching with use of a catalyst that comprises a noble metal.

* * * * *